United States Patent
Park et al.

(10) Patent No.: US 7,989,333 B2
(45) Date of Patent: Aug. 2, 2011

(54) METHODS OF FORMING INTEGRATED CIRCUIT DEVICES HAVING ANISOTROPICALLY-OXIDIZED NITRIDE LAYERS

(75) Inventors: Jae-Hwa Park, Gyeonggi-do (KR); Jong-Min Baek, Gyeonggi-do (KR); Gil-Heyun Choi, Seoul (KR); Hee-Sook Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 142 days.

(21) Appl. No.: 12/468,296

(22) Filed: May 19, 2009

(65) Prior Publication Data

US 2010/0029073 A1 Feb. 4, 2010

(30) Foreign Application Priority Data

Jun. 4, 2008 (KR) .................................. 2008-52649

(51) Int. Cl.
*H01L 21/3205* (2006.01)
(52) U.S. Cl. ........ 438/595; 438/535; 438/706; 438/725; 438/723; 257/411; 257/E21.002; 257/E23.179
(58) Field of Classification Search .................. 438/535, 438/396, 725, 787, 595, 723, 706; 257/411, 257/21.002, E23.179
See application file for complete search history.

(56) References Cited

U.S. PATENT DOCUMENTS

| | | | |
|---|---|---|---|
| 6,162,717 A | 12/2000 | Yeh | |
| 6,294,476 B1 * | 9/2001 | Lin et al. | 438/725 |
| 6,521,529 B1 * | 2/2003 | Ngo et al. | 438/664 |
| 2002/0160592 A1 * | 10/2002 | Sohn | 438/535 |
| 2005/0199940 A1 * | 9/2005 | Mine et al. | 257/315 |
| 2006/0138553 A1 * | 6/2006 | Brask et al. | 257/369 |
| 2006/0289952 A1 * | 12/2006 | Weimer | 257/411 |
| 2009/0090984 A1 * | 4/2009 | Khan et al. | 257/409 |
| 2009/0309166 A1 * | 12/2009 | Shima | 257/369 |
| 2010/0320522 A1 * | 12/2010 | Ozawa | 257/316 |

FOREIGN PATENT DOCUMENTS

| | | |
|---|---|---|
| KR | 1020060073048 A | 6/2006 |
| KR | 1020070031481 A1 | 3/2007 |

* cited by examiner

*Primary Examiner* — Jarrett J Stark
*Assistant Examiner* — Wilner Jean Baptiste
(74) *Attorney, Agent, or Firm* — Myers Bigel Sibley & Sajovec (57) ABSTRACT

Methods of forming integrated circuit devices include forming a gate electrode on a substrate and forming a nitride layer on a sidewall and upper surface of the gate electrode. The nitride layer is then anisotropically oxidized under conditions that cause a first portion of the nitride layer extending on the upper surface of the gate electrode to be more heavily oxidized relative to a second portion of the nitride layer extending on the sidewall of the gate electrode. A ratio of a thickness of an oxidized first portion of the nitride layer relative to a thickness of an oxidized second portion of the nitride layer may be in a range from about 3:1 to about 7:1.

12 Claims, 10 Drawing Sheets

METHODS OF FORMING INTEGRATED CIRCUIT DEVICES HAVING ANISOTROPICALLY-OXIDIZED NITRIDE LAYERS

REFERENCE TO PRIORITY APPLICATION

This application claims priority from Korean Patent Application No. 10-2008-0052649, filed Jun. 4, 2008, the disclosure of which is hereby incorporated herein by reference.

FIELD OF THE INVENTION

The present invention relates to methods of forming integrated circuit devices and, more particularly, to methods of forming integrated circuit devices having insulated gate electrodes.

BACKGROUND OF THE INVENTION

As the integration density of semiconductor devices increases and the line width of circuits decreases, the demand for reducing the resistance of gate patterns has steadily increased. In order to reduce the resistance of gate patterns, metal layers having low resistance have often been used along with polysilicon layers. The sidewalls of a gate pattern including a metal layer may be abnormally oxidized during a thermal treatment, oxidation, or deposition process, and thus, the gate pattern may deteriorate.

In order to address this problem, research has been conducted on a method of preventing the oxidation of a metal layer by using preliminary spacers. These spacers cover the sidewalls of the metal layer and expose the sidewalls of a polysilicon layer during the oxidation of a gate pattern. Research has also been conducted on a method of selectively oxidizing a polysilicon layer using plasma containing a mixture of hydrogen and oxygen. However, the former method typically requires complicated processes and may cause the width of the gate pattern to decrease by as much as the width of the preliminary spacers due to a decrease in the design rule of a semiconductor device. Thus, the former method may result in an increase in the resistance of the gate pattern. Further, the latter method involves the use of a hydrogen plasma, and may thus cause damage to a gate substrate or a gate insulation layer and/or increase a leakage current.

SUMMARY OF THE INVENTION

Methods of forming integrated circuit devices according to embodiments of the invention include forming a gate electrode on a substrate and forming a nitride layer on a sidewall and upper surface of the gate electrode. The nitride layer is then anisotropically oxidized under conditions that cause a first portion of the nitride layer extending on the upper surface of the gate electrode to be more heavily oxidized relative to a second portion of the nitride layer extending on the sidewall of the gate electrode. For example, a ratio of a thickness of an oxidized first portion of the nitride layer relative to a thickness of an oxidized second portion of the nitride layer may be in a range from about 3:1 to about 7:1.

According to some of these embodiments of the invention, the anisotropically oxidizing step may include anisotropically oxidizing the nitride layer for a sufficient duration to completely oxidize the first portion of the nitride layer but only partially oxidize the second portion of the nitride layer. In particular, the step of anisotropically oxidizing the nitride layer may include exposing the nitride layer to an oxygen-based plasma that is devoid of hydrogen and biased at a positive voltage, while simultaneously biasing the substrate with a negative voltage. For example, a difference between the positive voltage bias and the negative voltage bias may be in a range from about 150 Volts to about 400 Volts. According to additional embodiments of the invention, the oxygen-based plasma may include at least one of argon cations and helium cations.

The anisotropically oxidizing step may also be followed by a step of removing the completely oxidized first portion of the nitride layer from the upper surface of the gate electrode. This step may also include removing oxide from the partially oxidized second portion of the nitride layer to thereby expose a thinned nitride layer on the sidewall of the gate electrode. Following this removal step, an oxide layer may be conformally deposited on the thinned nitride layer and on the upper surface of the gate electrode.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EXEMPLARY EMBODIMENTS

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout. As used herein the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can, therefore, encompass both an orientation of above and below.

A semiconductor device according to an exemplary embodiment of the present invention will hereinafter be described in detail with reference to FIG. 1.

Figure 1:
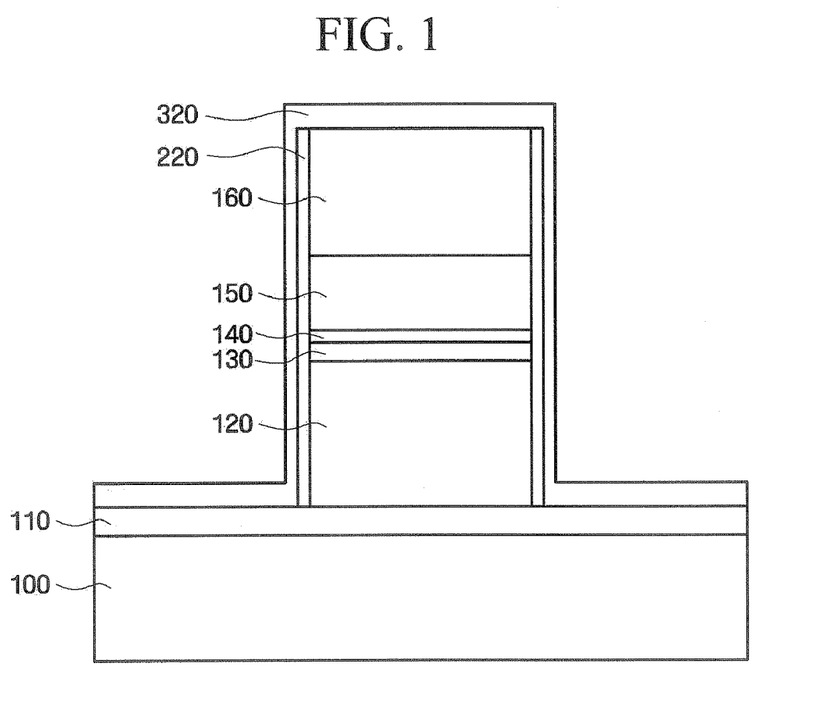
FIG. 1 illustrates a cross-sectional view of a semiconductor device according to a first exemplary embodiment of the present invention.

FIG. 1 illustrates a cross-sectional view of a semiconductor device according to a first exemplary embodiment of the present invention. Referring to FIG. 1, the semiconductor device includes a gate insulation layer 110 and a gate pattern 120, 130, 140, 150 and 160.

The substrate 100 may be a rigid substrate such as a semiconductor substrate formed of at least one of Si, Ge, SiGe, GaP, GaAs, SiC, SiGeC, InAs and InP, a quartz substrate or a glass substrate for use in a display device. Alternatively, the substrate 100 may be a flexible plastic substrate formed of polyimide, polyethylene terephthalate (PET), polyethylene naphthalate (PEN), polymethyl methacrylate (PMMA), polycarbonate (PC), polyestersulfone (PES), or polyester.

The gate insulation layer 110 may be formed on the substrate 100. The gate insulation layer 110 may include a deposition layer which is formed of a silicon oxide layer, SiON, $Ge_xO_yN_z$, $Ge_xSi_yO_z$, a high-dielectric material or a combination thereof or a deposition layer in which a silicon oxide layer, SiON, $Ge_xO_yN_z$, $Ge_xSi_yO_z$, and a high-dielectric material are sequentially stacked. Examples of the high-dielectric material that may be used in the formation of the gate insulation layer 110 include $HfO_2$, ZrO2, $Al_2O_3$, $Ta_2O_5$, hafnium silicate, zirconium silicate and a combination thereof.

The gate pattern 120, 130, 140, 150 and 160 may be formed on the gate insulation layer 110. The gate pattern 120, 130, 140, 150 and 160 may include a polysilicon layer 120, an ohmic layer 130, a barrier layer 140, a metal layer 150 and a capping layer 160.

The polysilicon layer 120 adjusts a work function so as to be suitable for an n-channel metal oxide semiconductor (NMOS) or a p-channel metal oxide semiconductor (PMOS).

The polysilicon layer 120 may be doped with n- or p-type impurities. Examples of the p-type impurities include phosphor (P) and asbestos (As). Examples of the n-type impurities include boron (B), boron fluoride ($BF_2$), and indium (In).

The ohmic layer 130 may be formed on the polysilicon layer 120. The ohmic layer 130 reduces the contact resistance between the polysilicon layer 120 and the metal layer 150. The ohmic layer 130 may be formed of tungsten silicide.

The barrier layer 140 may be formed on the ohmic layer 130. The barrier layer 140 prevents the reaction between the polysilicon layer 120 and the metal layer 150 during subsequent thermal treatment processes. The barrier layer 140 may be formed of a metal nitride such as tungsten nitride, titanium nitride, tantalum nitride or boron nitride.

The metal layer 150 may be formed on the barrier layer 140. The metal layer 150 may be formed of a high-melting point metal, which is a metal having a higher melting point than that of iron, i.e., 1539° C. Examples of the high-melting point metal include tungsten (W), rhenium (Re), tantalum (Ta), osmium (Os), molybdenum (Mo), niobium (Nb), vanadium (V), hafnium (Hf), zirconium (Zr), and titanium (Ti). In particular, a tungsten layer may be used as a high-melting point layer because of its ease of application to the fabrication of a semiconductor device, but the present invention is not restricted to this.

The capping layer may be formed on the metal layer 150. The capping layer 160 may be used as a mask during a patterning process for forming the gate pattern 120, 130, 140, 150 and 160 and may protect the metal layer 150 from subsequent processes such as the formation of a contact (not shown). For example, the capping layer 160 may be formed of a dielectric material, for example, silicon nitride (SiN).

The gate pattern 120, 130, 140, 150 and 160 may include the polysilicon layer 120, the ohmic layer 130, the barrier layer 140, the metal layer 150 and the capping layer 160.

A nitride layer 220 is formed on the entire sidewalls of the gate pattern 120, 130, 140, 150 and 160. The nitride layer 220 may be interpreted as including silicon nitride unless specified otherwise. The nitride layer 220 may be formed conformally on the entire sidewalls of the gate pattern 120, 130, 140, 150 and 160, but not on the top of the gate pattern 120, 130, 140, 150 and 160 and on the surfaces of portions of the substrate 100 on which the gate pattern 120, 130, 140, 150 and 160 is not formed. That is, the nitride layer 220 may be formed only on the entire sidewalls of the gate pattern 120, 130, 140, 150 and 160 and may have the same thickness throughout the entire sidewalls of the gate pattern 120, 130, 140, 150 and 160. The nitride layer 220 may have a thickness of about 30-100 Å.

The semiconductor device of the first exemplary embodiment may also include a curing oxide layer 320. The curing oxide layer 320 conformally covers the surfaces of the portions of the substrate 100 on which the gate pattern 120, 130, 140, 150 and 160 is not formed. An oxide layer may be interpreted as being a silicon oxide layer or a silicon oxynitride layer unless specified otherwise.

The curing oxide layer 320 may include an oxide layer with little hydrogen or no hydrogen at all and may thus be less likely to cause a leakage current.

Due to the curing oxide layer 320, the boundary between the substrate 100 and the polysilicon layer 120 may become round. In this case, it is possible to prevent the concentration of an electric field on sharp edges between the polysilicon layer 120 and the substrate and thus to improve the electric properties of a semiconductor device. Therefore, even when a charge of 0.01-0.3 $C/cm^2$ is applied to the gate insulation layer 110 and the curing oxide layer 320, the probability of the breakdown of the gate insulation layer 110 and the curing oxide layer 320 is about 10% or less, i.e., only 10% or less of all gate insulation samples and all curing oxide layer samples are likely to break down.

The nitride layer 220 and the curing oxide layer 320 are both formed on the sidewalls of the gate pattern 120, 130, 140, 150 and 160, and overlap each other. Therefore, the electric properties of the nitride layer and the curing oxide layer 320 may be improved, and may thus be less likely to break down even when a voltage of about 29 V or higher is applied.

Figure 2A:
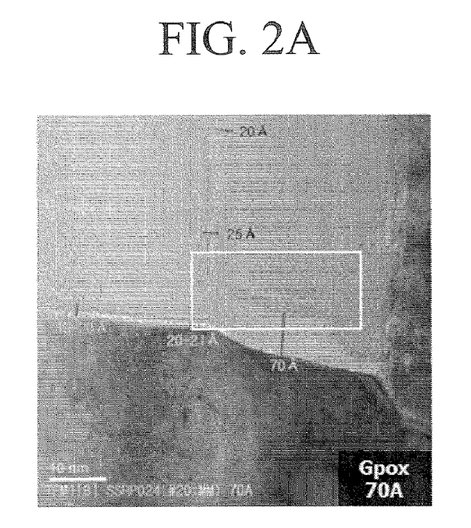
FIG. 2A shows a photographic image of the cross-section of a semiconductor device according to a comparative example.
Figure 2B:
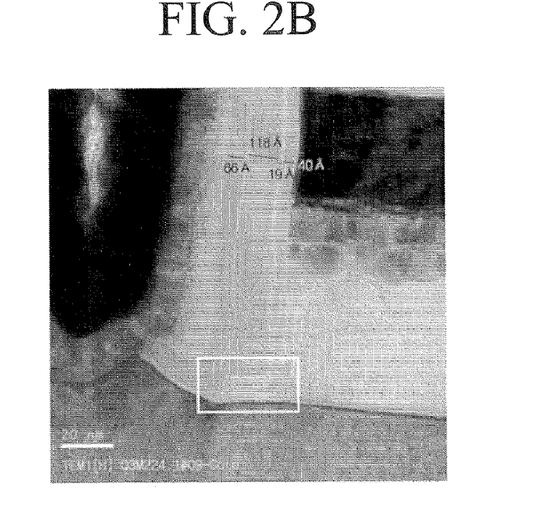
FIG. 2B shows a photographic image of the cross-section of the semiconductor device of the first exemplary embodiment.

Referring to FIGS. 2A and 2B, the nitride layer 220 and the curing oxide layer 320 are both formed on the sidewalls of the gate pattern 120, 130, 140, 150 and 160, and overlap each other. The nitride layer 220 is formed only on the sidewalls of the gate pattern 120, 130, 140, 150 and 160. FIG. 2A shows a photographic image of the cross-section of a semiconductor device according to a comparative example, and FIG. 2B shows a photographic image of the cross-section of the semiconductor device of the first exemplary embodiment.

Referring to a rectangular outline shown in FIG. 2A, a nitride layer extends along the sidewalls of a gate pattern and is bent into an L shape toward a substrate.

Referring to a rectangular outline shown in FIG. 2B, a nitride layer does not extend along the surface of a substrate and is formed in parallel with a sidewall of a gate pattern.

That is, in the semiconductor device of the first exemplary embodiment, a nitride layer is formed only on the sidewalls of a gate pattern, thereby improving the properties of layers on a semiconductor substrate. In addition, the nitride layer overlaps an oxide layer, thereby improving the properties of the sidewalls of the gate pattern 120, 130, 140, 150 and 160.

Source and drain regions (not shown) may be formed on both sides of a gate pattern by implanting n- or p-type impurities into a substrate, and an interlayer dielectric layer (not shown) may be formed on the substrate and on the gate pattern 120, 130, 140, 150 and 160. The source and drain regions may be connected to upper wiring layers (not shown) through contacts (not shown) formed through the interlayer dielectric layer.

Methods of fabricating a semiconductor device according to other exemplary embodiments of the present invention will hereinafter be described in detail with reference to FIGS. 1 and 3 through 7. FIGS. 3 through 7 illustrate cross-sectional views for explaining methods of fabricating a semiconductor device according to second and third exemplary embodiments of the present invention. In FIGS. 1 and 3 through 7, like reference numerals indicate like elements, and thus, detailed descriptions thereof will be omitted.

Figure 3:
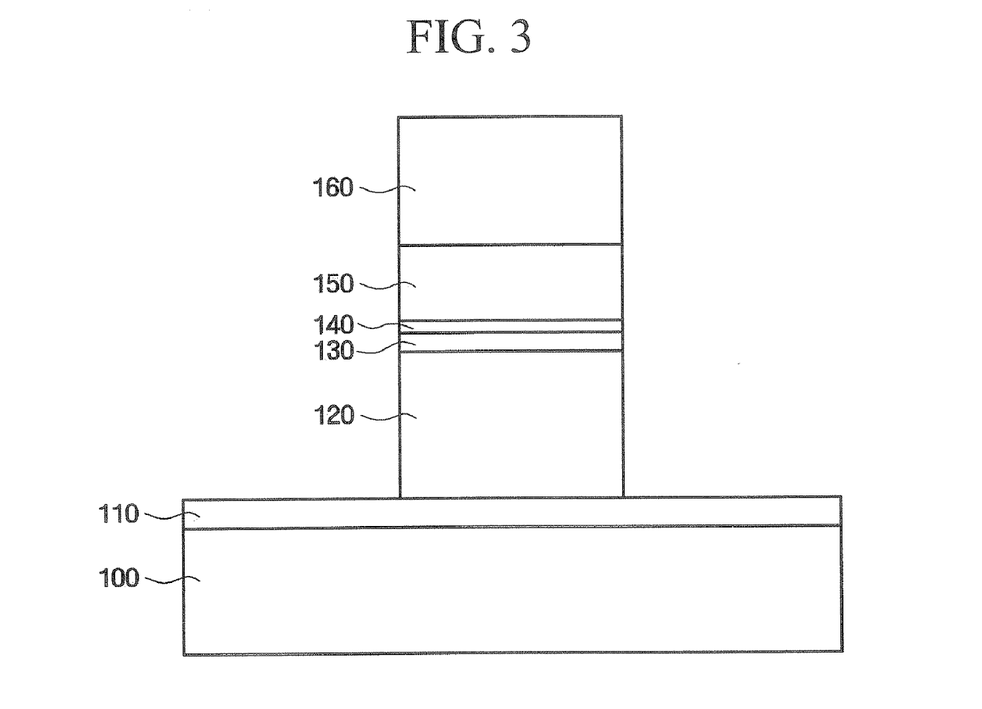
FIGS. 3 through 7 illustrate cross-sectional views for explaining methods of fabricating a semiconductor device according to second and third exemplary embodiments of the present invention.

Referring to FIG. 3, a gate insulation layer 110 is formed on a substrate 100. More specifically, the gate insulation layer 110 may be formed by depositing a dielectric material on the substrate 100 using, for example, a chemical vapor deposition (CVD) method or by thermally oxidizing the substrate 100.

Thereafter, a gate pattern including a polysilicon layer 120, an ohmic layer 130, a barrier layer 140, a metal layer 150 and a capping layer 160 may be formed on the gate insulation layer 110.

Figure 4:
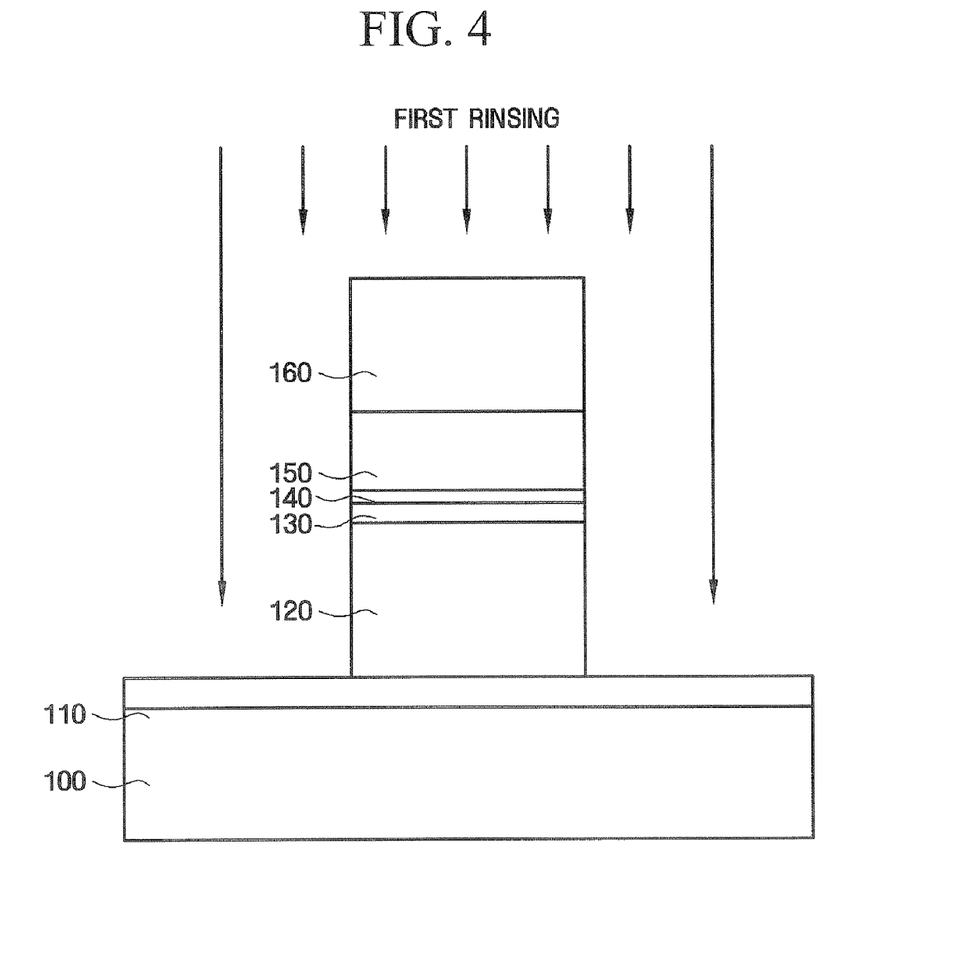

Thereafter, referring to FIG. 4, a first rinsing operation is performed on the substrate 100 by using, for example, HF. As a result of the first rinsing operation, defective oxides that may have been generated during an etching operation for forming the gate pattern are removed.

Figure 5:
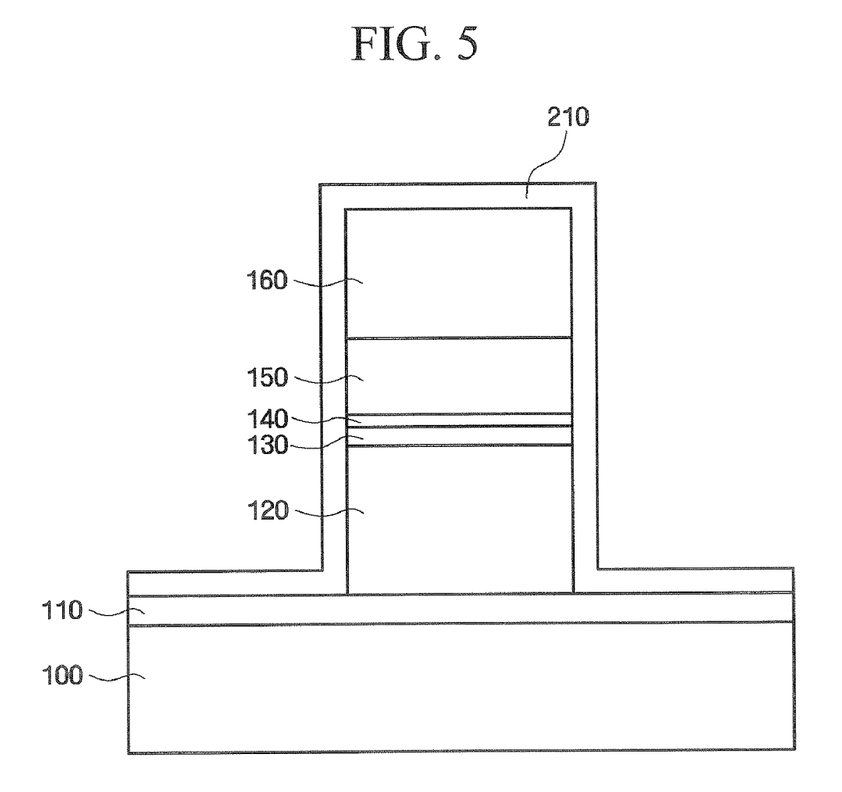

Thereafter, referring to FIG. 5, a nitride layer 210 is conformally formed on the substrate 100 so that the top surface and the sidewalls of the gate pattern and the surfaces of portions of the substrate 100 on which the gate pattern is not formed can be covered with the nitride layer 210. The expression "conformally forming a layer" as used herein not only indicates forming a layer to substantially have a uniform thickness throughout a whole semiconductor device but also indicates forming a layer to seemingly have a uniform thickness through a whole semiconductor device.

The nitride layer 210 may be formed by using, for example, a low-pressure atomic layer deposition (LPALD) method. The nitride layer 210 may be formed to a thickness of about 30-100 Å in consideration of a subsequent plasma oxidation operation.

Figure 6:
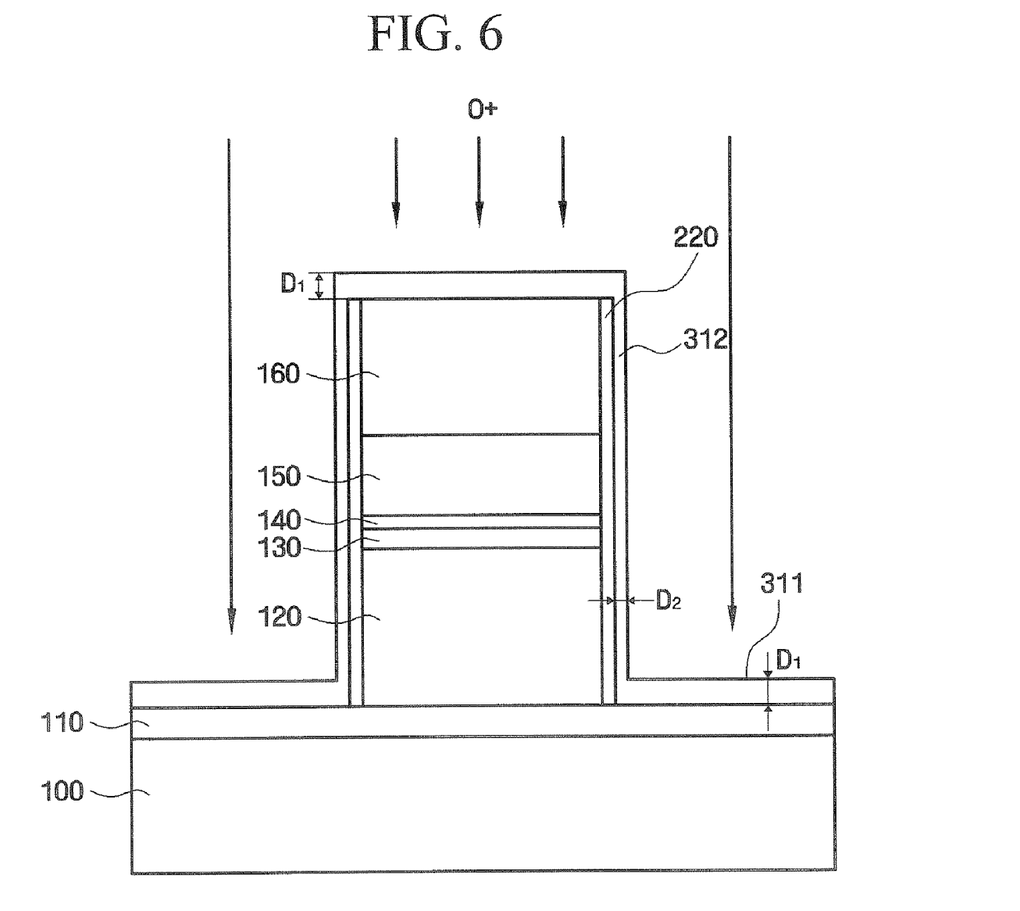

Thereafter, referring to FIGS. 5 and 6, anisotropic oxidation is performed on the nitride layer 210 by using a plasma gas. Anisotropic oxidization is characterized in that the degree of oxidation varies according to the direction of formation of an oxide. The term "anisotropic" as used herein may be interpreted as being associated with electrical directivity.

The plasma gas may contain oxygen cations and may also contain argon cations and/or helium cations. That is, the plasma gas may contain the mixture of oxygen cations and argon cations, the mixture of oxygen cations and helium cations or the mixture of oxygen cations, argon cations, and helium cations. The oxygen cations included in the plasma gas oxidizes the nitride layer 210, thereby forming an oxide layer having first oxide layer portions 311 and second oxide layer portions 312. The inert gas (such as argon or helium) included in the plasma gas promotes the oxidation of the nitride layer 210.

Anisotropic oxidation may be performed on the substrate 100 by applying a power of 100-1000 W to a chamber at a temperature between room temperature and 1000° C. under a pressure of 10-100 Pa and injecting an oxygen-based plasma into the chamber at a flux of 10-1000 sccm.

More specifically, in order to perform anisotropic oxidation on the nitride layer 210, the substrate 100 may be inserted into the chamber, a positive voltage is applied to the plasma contained in the chamber, and a negative voltage is applied to the substrate 100.

In order to perform anisotropic oxidation and thus to make the degree of oxidation higher in a direction perpendicular to the surface of the substrate 100 than in a direction parallel to the surface of the substrate 100, the difference between the voltage applied to the plasma contained in the chamber and the voltage applied to the substrate 100 may be within the range of about 150-400 V.

When a negative voltage is applied to the substrate 100, most oxygen cations in the chamber move toward the direction perpendicular to the surface of the substrate 100, and thus, portions of the nitride layer 210 on the top surface of the gate pattern and on the surfaces of the portions of the substrate 100 on which the gate pattern is not formed are more oxidized than portions of the nitride layer 210 on the sidewalls of the gate pattern. As a result, a thickness $D_1$ of the first oxide layer portions 311 is greater than a thickness $D_2$ of the second oxide layer portions 312. More specifically, the first oxide layer portions 311 are obtained by oxidizing the portions of the nitride layer 210 on the top surface of the gate pattern and on the surfaces of the portions of the substrate 100 on which the gate pattern is not formed, and the second oxide layer portions 312 are obtained by oxidizing the portions of the nitride layer 210 on the sidewalls of the gate pattern. The ratio of the thicknesses $D_1$ and $D_2$ may be about 3:1 to about 7:1. The portions of the nitride layer 210 on the top surface of the gate pattern and on the surfaces of the portions of the substrate 100 on which the gate pattern is not formed may be completely oxidized, and the portions of the nitride layer 210 on the sidewalls of the gate pattern may be only partially oxidized.

Figure 7:
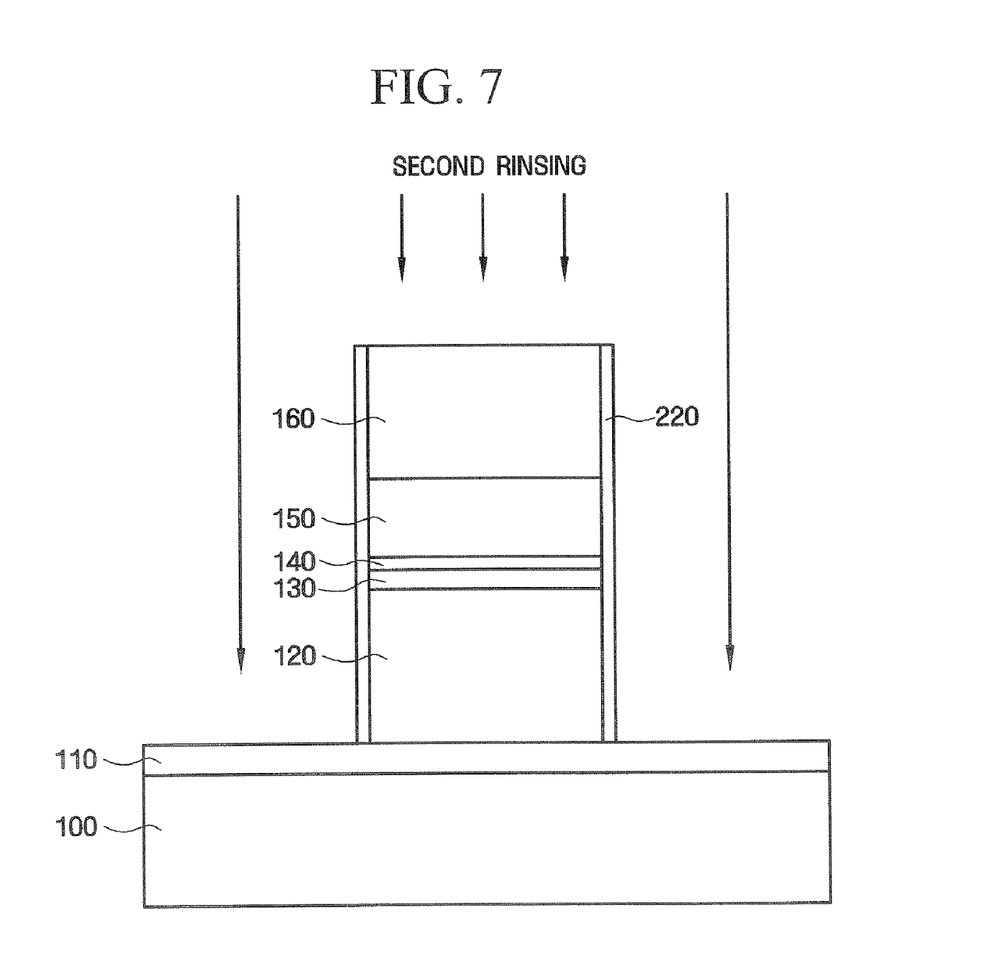

Thereafter, referring to FIGS. 6 and 7, a second rinsing operation is performed on the substrate 100. The second rinsing operation, like the first rinsing operation, may involve the use of, for example, HF. As a result of the second rinsing operation, the first oxide layer portions 311 and the second oxide layer portions 312 are all removed, and a nitride layer 220 is formed on the sidewalls of the gate pattern. Due to the nitride layer 220, the metal layer 150 included in the gate pattern can be protected from the reoxidation of the gate pattern. Thus, it is possible to prevent the abnormal oxidation of the metal layer 150.

Referring to FIG. 1, a curing oxide layer 320 is conformally formed on the nitride layer 220, the top surface of the gate pattern and the surfaces of the portions of the substrate 100 on which the gate patter is not formed.

More specifically, the curing oxide layer 320 may be formed using an oxygen-based plasma containing no hydrogen. That is, the curing oxide layer 320 may be formed using a non-hydrogen-based plasma, thereby preventing damage to the substrate 100 or the gate insulation layer 110.

According to the second exemplary embodiment, there is no need to additionally form preliminary spacers for preventing the oxidation of the metal layer 150. Thus, the width of the gate pattern increases for a given design rule, and the resistance of wiring layers decreases. In addition, it is possible to improve the electric properties and the reliability of a semiconductor device by preventing the substrate 100 or the gate insulation layer 110 from being damaged by a hydrogen plasma used to selectively oxidize the polysilicon layer 120.

In the third exemplary embodiment, unlike in the second exemplary embodiment, the curing oxide layer 320 may be formed by using a thermal oxidation method such as a rapid thermal process (RTP) or a thermal furnace method.

Figure 8:
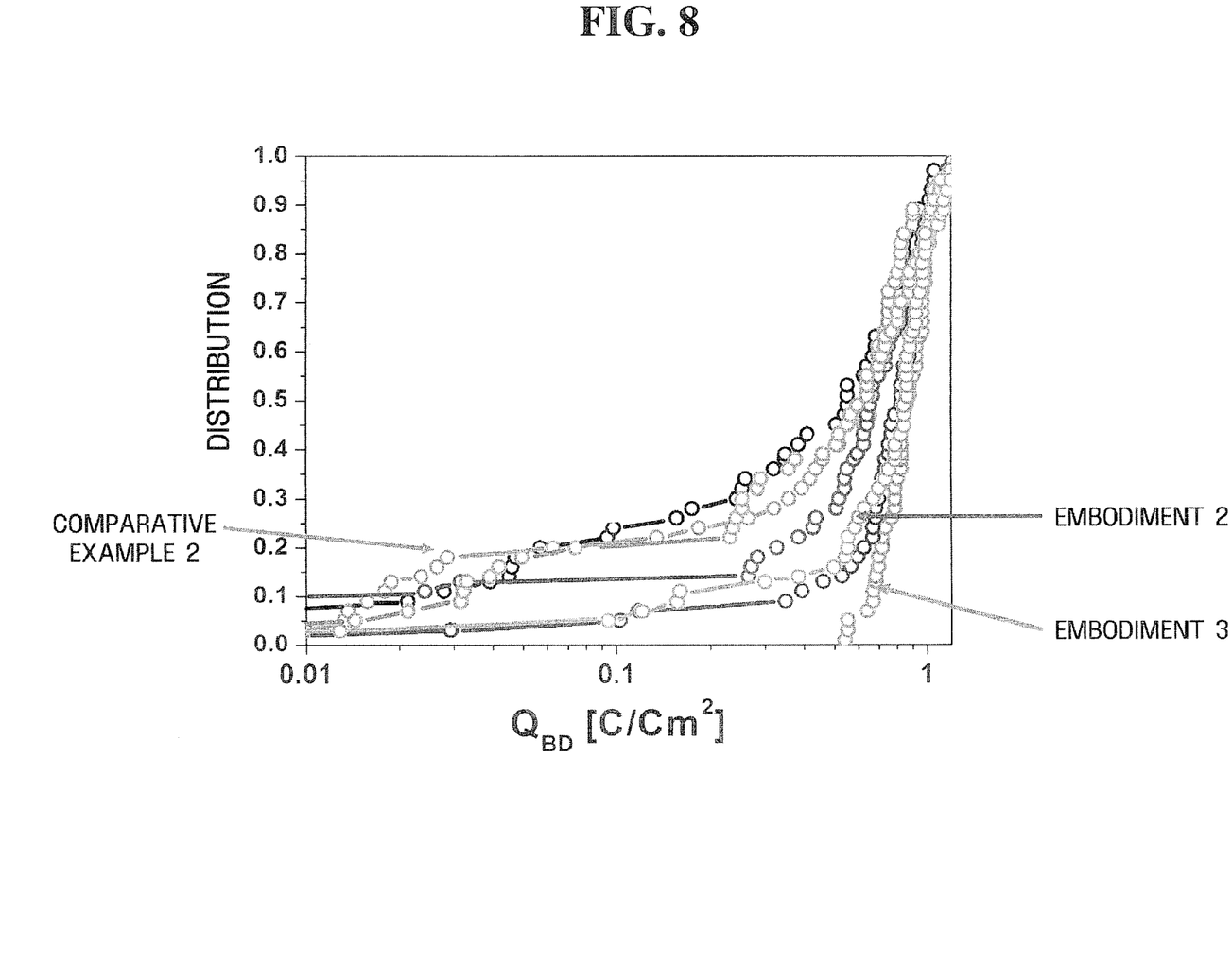
FIG. 8 illustrates a graph for comparing the breakdown strength of semiconductor devices obtained by the methods of the second and third exemplary embodiments with the breakdown strength of a semiconductor device according to Comparative Example 1.

The properties of semiconductor devices (hereinafter referred to as the semiconductor devices according to Embodiments 2 and 3) obtained by the methods of the second and third exemplary embodiments will hereinafter be compared with the properties of semiconductor devices according to comparative examples with reference to FIGS. 8 through 11. FIG. 8 illustrates a graph for comparing the breakdown strength of the semiconductor devices according to Embodiments 2 and 3 with the breakdown strength of a semiconductor device according to Comparative Example 1, FIG. 9 illustrates a graph for comparing the leakage current properties of each of the semiconductor devices according to Embodiments 2 and 3 with the leakage current properties of the semiconductor device according to Comparative Example 1 and a semiconductor device according to Comparative Example 2, FIG. 10 illustrates a graph for comparing the leakage current properties of a gate pattern and a bitline of each of the semiconductor devices according to Embodiments 2 and 3 with the leakage current properties of a gate pattern and a bitline of each of the semiconductor devices according to Comparative Examples 2 and 3, and FIG. 11 illustrates a graph for comparing the leakage current properties of a nitride layer and an oxide layer of each of the semiconductor devices according to Embodiments 2 and 3 with the leakage current properties of a nitride layer and an oxide layer of each of the semiconductor devices according to Comparative Examples 2 and 3.

It was monitored whether a gate insulation layer and a curing oxide layer of each of the semiconductor devices according to Embodiments 2 and 3 and the semiconductor device according to Comparative Example 1, i.e., a semiconductor device obtained by selectively oxidizing a polysilicon layer, were damaged while increasing the charge applied to the gate insulation layer and the curing oxide layer of each of the semiconductor devices according to Embodiments 2 and 3 and the semiconductor device according to Comparative Example 1, and the results of the monitoring are as illustrated in FIG. 8. Referring to FIG. 8, even when a charge of 0.01-0.3 $C/cm^2$ is applied to the gate insulation layer and the curing oxide layer of each of the semiconductor devices according to Embodiments 2 and 3, the probability of the breakdown of the gate insulation layer and the curing oxide layer of each of the semiconductor devices according to Embodiments 2 and 3 is about 10% or less. On the other hand, when a charge of 0.02 $C/cm^2$ is applied to the semiconductor device according to Comparative Example 1, the probability of the breakdown of the gate insulation layer and the curing oxide layer of the semiconductor device according to Comparative Example 1 is about 20% or more. Therefore, the gate insulation layer and the curing oxide layer of each of the semiconductor devices according to Embodiments 2 and 3 have more excellent current properties than the gate insulation layer and the curing oxide layer of the semiconductor device according to Comparative Example 1.

Figure 9:
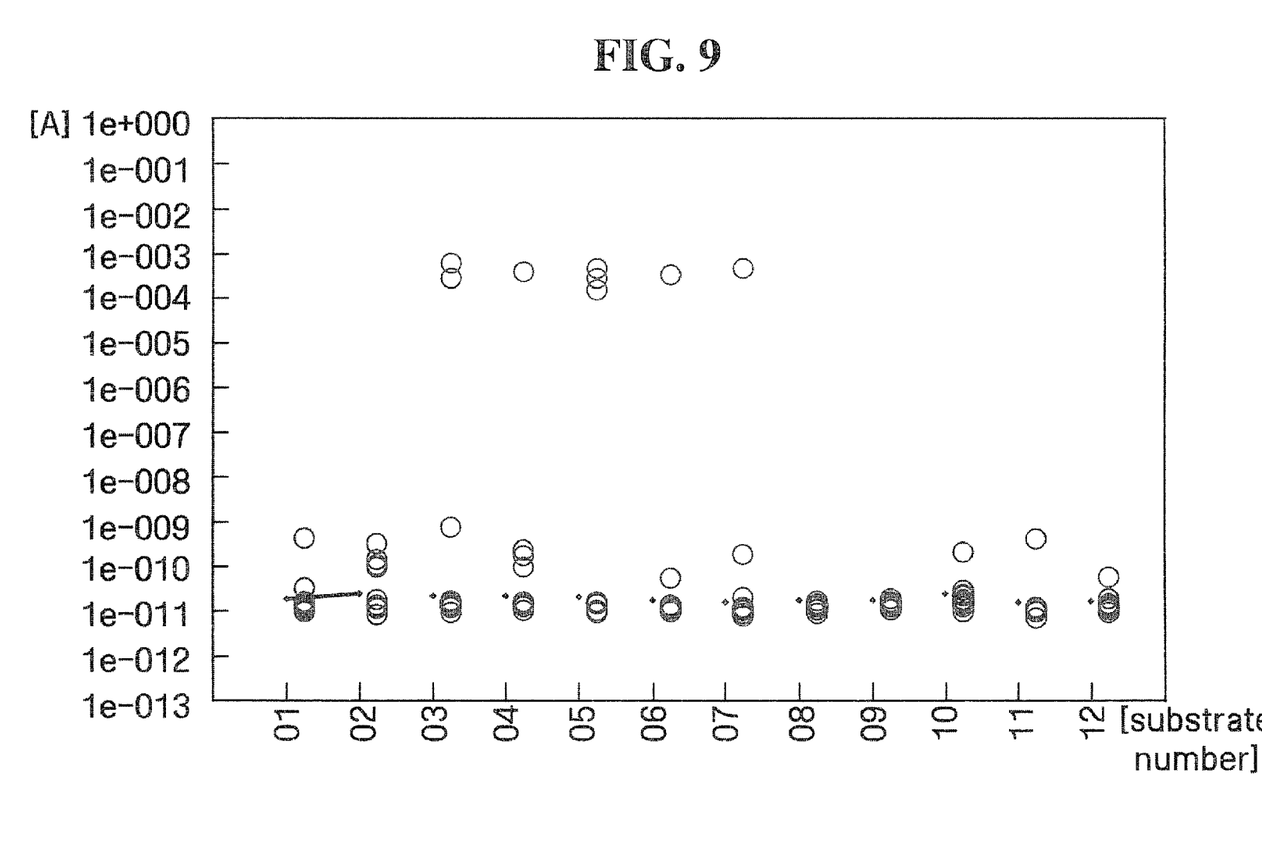
FIG. 9 illustrates a graph for comparing the leakage current properties of the semiconductor devices obtained by the methods of the second and third exemplary embodiments with the leakage current properties of semiconductor devices according to Comparative Example 1 and a semiconductor device according to Comparative Example 2.

Referring to FIG. 9, substrate numbers 11 and 12 represent the semiconductor devices according to Embodiments 2 and 3, respectively, substrate number 1 represents a semiconductor device according to Comparative Example 1, i.e., a semiconductor device obtained by preventing the abnormal oxidation using preliminary spacers, and substrate number 10 represents a semiconductor device according to Comparative Example 2, i.e., a semiconductor device obtained by selectively oxidizing a polysilicon layer. Referring to FIG. 9, the leakage current properties of the gate patterns of the semiconductor devices according to Embodiments 2 and 3 are almost the same as the leakage current properties of the gate patterns of the semiconductor devices according to Comparative Examples 1 and 2.

Figure 10:
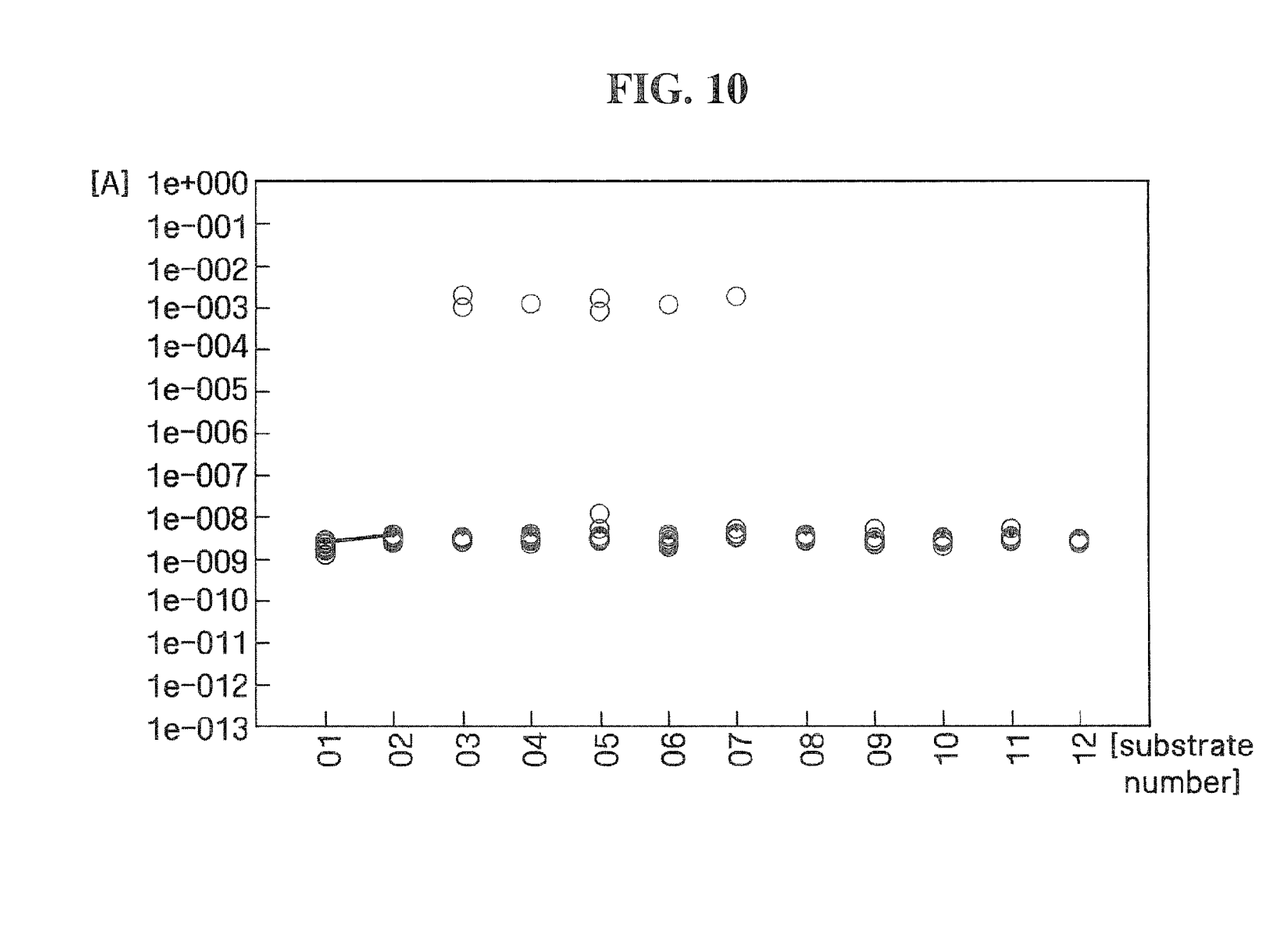
FIG. 10 illustrates a graph for comparing the leakage current properties of a gate pattern and a bitline of each of the semiconductor devices obtained by the methods of the second and third exemplary embodiments with the leakage current properties of a gate pattern and a bitline of each of the semiconductor devices according to Comparative Example 1 and the semiconductor device according to Comparative Example 2.
Figure 11:
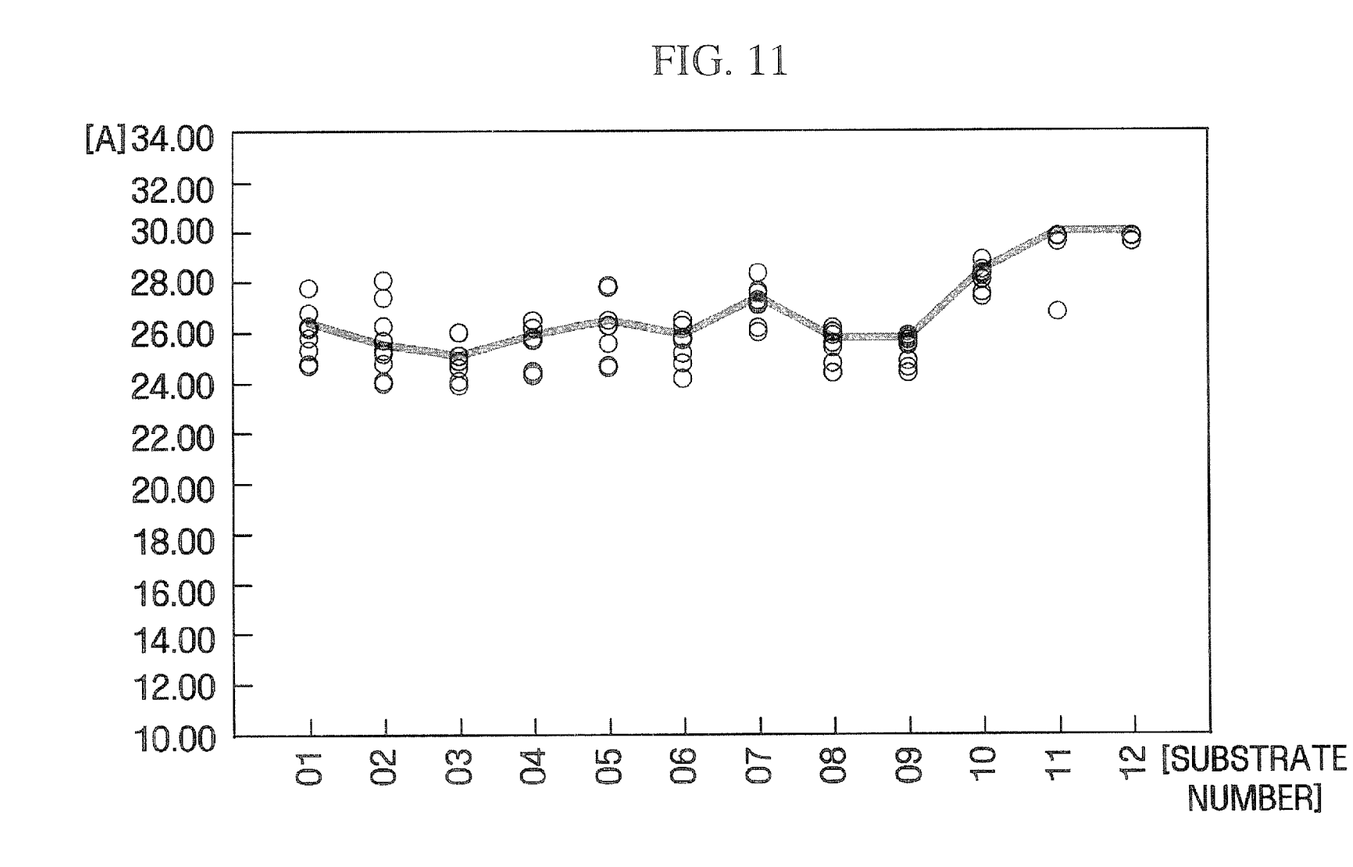
FIG. 11 illustrates a graph for comparing the leakage current properties of a nitride layer and an oxide layer of each of the semiconductor devices obtained by the methods of the second and third exemplary embodiments with the leakage current properties of a nitride layer and an oxide layer of each of the semiconductor devices according to Comparative Example 1 and the semiconductor device according to Comparative Example 2.

Referring to FIG. 10, substrate numbers 11 and 12 represent the semiconductor devices according to Embodiments 2 and 3, respectively, substrate number 1 represents a semiconductor device according to Comparative Example 1, i.e., a semiconductor device obtained by preventing the abnormal oxidation using preliminary spacers, and substrate number 10 represents a semiconductor device according to Comparative Example 2, i.e., a semiconductor device obtained by selectively oxidizing a polysilicon layer. Referring to FIG. 10, the leakage current properties of the bitlines and the gate patterns of the semiconductor devices according to Embodiments 2 and 3 are almost the same as the leakage current properties of the bitlines and the gate patterns of the semiconductor devices according to Comparative Examples 1 and 2.

Referring to FIG. 11, substrate numbers 11 and 12 represent the semiconductor devices according to Embodiments 2 and 3, respectively, substrate numbers 1 through 9 represent semiconductor devices according to Comparative Example 1, i.e., semiconductor devices obtained by preventing the abnormal oxidation using preliminary spacers, and substrate number 10 represents a semiconductor device according to Comparative Example 2, i.e., a semiconductor device obtained by selectively oxidizing a polysilicon layer. Referring to FIG. 11, the nitride layers and the curing oxide layers of the semiconductor devices according to Embodiments 2 and 3 have a breakdown strength of about 29 V or more. On the other hand, the nitride layers and the curing oxide layers of the semiconductor devices according to Comparative Example 1 and the semiconductor device according to Comparative Example 2 have a relatively low breakdown strength of about 29 V or less.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device, the method comprising:
   forming a gate insulation layer on a substrate;
   forming a gate pattern on the gate insulation layer, the gate pattern comprising a polysilicon layer and a metal layer;
   conformally forming a first nitride layer on sidewalls and a top surface of the gate pattern and on portions of the substrate on which the gate pattern is not formed;
   forming an oxynitride layer by anisotropically oxidizing at least a portion of the first nitride layer using an oxygen-based plasma, said oxynitride layer comprising a first oxynitride region of a first thickness on the top surface of the gate pattern and a second oxynitride region of a second thickness on the sidewalls of the gate pattern, and wherein a ratio of the first thickness to the second thickness is in a range from about 3:1 to about 7:1; and
   removing the oxynitride layer to expose a top surface of the gate pattern and expose a second nitride layer on sidewalls of the gate pattern.

2. The method of claim 1, wherein said anisotropically oxidizing comprises completely oxidizing portions of the nitride layer on the top surface of the gate pattern and partially oxidizing portions of the nitride layer on the sidewalls of the gate pattern.

3. The method of claim 1, wherein said forming an oxynitride layer comprises placing the substrate in a chamber, applying a positive voltage to the oxygen-based plasma and applying a negative voltage to the substrate.

4. The method of claim 3, wherein the difference between the positive voltage and the negative voltage is about 150-400 V.

5. The method of claim 3, wherein the oxygen-based plasma comprises at least one of argon cations and helium cations.

6. The method of claim 1, further comprising conformally forming a curing oxide layer on the second nitride layer on the sidewalls of the gate pattern and on the top surface of the gate pattern.

7. The method of claim 6, wherein the conformally forming the curing oxide layer comprises using an oxygen-based plasma containing no hydrogen.

8. The method of claim 6, wherein conformally forming the curing oxide layer comprises using a thermal oxidation method.

9. The method of claim 1, wherein the forming of the gate pattern comprises forming a capping layer of a nitride on the metal layer.

10. The method of claim 1, wherein the forming of the gate pattern comprises forming an ohmic layer and a barrier layer after the formation of the polysilicon layer and before the formation of the metal layer.

11. A method of forming an integrated circuit transistor, comprising:
    forming a gate pattern on a substrate;
    forming a nitride layer on sidewalls and an upper surface of the gate pattern;
    converting all of the nitride layer on the upper surface of the gate pattern and portions of the nitride layer on the sidewalls of the gate pattern to oxynitride by anisotropically oxidizing the nitride layer using an oxygen-based plasma;
    removing the oxynitride from the gate pattern to thereby expose the upper surface of the gate pattern and expose remaining nitride spacers on the sidewalls of the gate pattern; and
    forming a curing oxide layer on the exposed upper surface of the gate pattern and on the exposed nitride spacers.

12. The method of claim 11, wherein conditions of the oxygen-based plasma are configured to cause the oxynitride on the upper surface of the gate pattern to be about three to seven times as thick as the oxynitride on the sidewalls of the gate pattern.

* * * * *